(12) United States Patent
Takayama et al.

(10) Patent No.: US 8,692,577 B2
(45) Date of Patent: Apr. 8, 2014

(54) DRIVER CIRCUIT

(75) Inventors: Toru Takayama, Yokohama (JP);
Hirotoshi Aizawa, Kawasaki (JP);
Shinya Takeshita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 13/462,070

(22) Filed: May 2, 2012

(65) Prior Publication Data

US 2013/0194003 A1    Aug. 1, 2013

(30) Foreign Application Priority Data

Jan. 26, 2012  (JP) ................................ 2012-014458

(51) Int. Cl.
*H03K 19/094* (2006.01)

(52) U.S. Cl.
USPC ................ 326/83; 326/87; 327/109; 327/112

(58) Field of Classification Search
USPC ........... 326/82–83, 86–87; 327/108–109, 112
See application file for complete search history.

(56) References Cited

U.S. PATENT DOCUMENTS

| | | | |
|---|---|---|---|
| 7,053,679 B2* | 5/2006 | Rho | 327/108 |
| 7,449,913 B1 | 11/2008 | Hung | |
| 7,626,423 B1 | 12/2009 | Li et al. | |
| 8,476,931 B2* | 7/2013 | Matsuoka | 326/86 |
| 2003/0189446 A1* | 10/2003 | Yoo et al. | 327/108 |
| 2009/0302891 A1* | 12/2009 | Kim et al. | 326/82 |
| 2011/0187439 A1 | 8/2011 | Sugie | |

FOREIGN PATENT DOCUMENTS

JP          2005-86380       3/2005

* cited by examiner

*Primary Examiner* — Jason M Crawford
(74) *Attorney, Agent, or Firm* — Oblon, Spivak, McClelland, Maier & Neustadt, L.L.P.

(57) ABSTRACT

The driver circuit includes a first controlling circuit that outputs, to a gate of the auxiliary pMOS transistor, a first controlling signal that rises in synchronization with a rising of the first pulse signal and falls after a delay from a falling of the first pulse signal. The driver circuit includes a second controlling circuit that outputs, to a gate of the auxiliary nMOS transistor, a second controlling signal that rises in synchronization with a rising of the second pulse signal and falls after a delay from a falling of the second pulse signal.

20 Claims, 8 Drawing Sheets

DRIVER CIRCUIT

CROSS-REFERENCE TO RELATED APPLICATION

This application is based upon and claims the benefit of priority from the prior Japanese Patent Application No. 2012-014458, filed on Jan. 26, 2012, the entire contents of which are incorporated herein by reference.

BACKGROUND

1. Field

Embodiments described herein relate generally to a output circuit outputting a signal and an output control system.

2. Background Art

A conventional driver circuit has a problem that, when the gate impedance is increased to adjust the through rate, a parasitic capacitance of the output MOS transistor can affect switching of the driver circuit to cause a through current.

DETAILED DESCRIPTION

A driver circuit according to an embodiment includes an output pMOS transistor that is connected, at a source thereof, to a first terminal to which a first potential is applied and, at a drain thereof, to an output terminal at which an output signal is output, the source and a back gate of the output pMOS transistor being connected to each other. The driver circuit includes an output nMOS transistor that is connected, at a source thereof, to a second terminal to which a second potential lower than the first potential is applied and to the output terminal at a drain thereof, the source and a back gate of the output nMOS transistor being connected to each other. The driver circuit includes a first pre-driver circuit that is connected to a gate of the output pMOS transistor at an output part thereof, receives a first pulse signal at an input part thereof, and outputs, at an output part thereof, a first gate signal that is obtained by inverting the first pulse signal. The driver circuit includes a second pre-driver circuit that is connected to a gate of the output nMOS transistor at an output part thereof, receives a second pulse signal at an input part thereof, and outputs, at an output part thereof, a second gate signal that is obtained by inverting the second pulse signal. The driver circuit includes an auxiliary pMOS transistor that is connected to a first potential line at a source thereof and to the gate of the output pMOS transistor at a drain thereof. The driver circuit includes an auxiliary nMOS transistor that is connected at a source thereof to a second potential line having a lower potential than the first potential and to the gate of the output nMOS transistor at a drain thereof. The driver circuit includes a first controlling circuit that outputs, to a gate of the auxiliary pMOS transistor, a first controlling signal that rises in synchronization with a rising of the first pulse signal and falls after a delay from a falling of the first pulse signal. The driver circuit includes a second controlling circuit that outputs, to a gate of the auxiliary nMOS transistor, a second controlling signal that rises in synchronization with a rising of the second pulse signal and falls after a delay from a falling of the second pulse signal.

In the following, embodiments will be described with reference to the drawings.

(First Embodiment)

Figure 1:
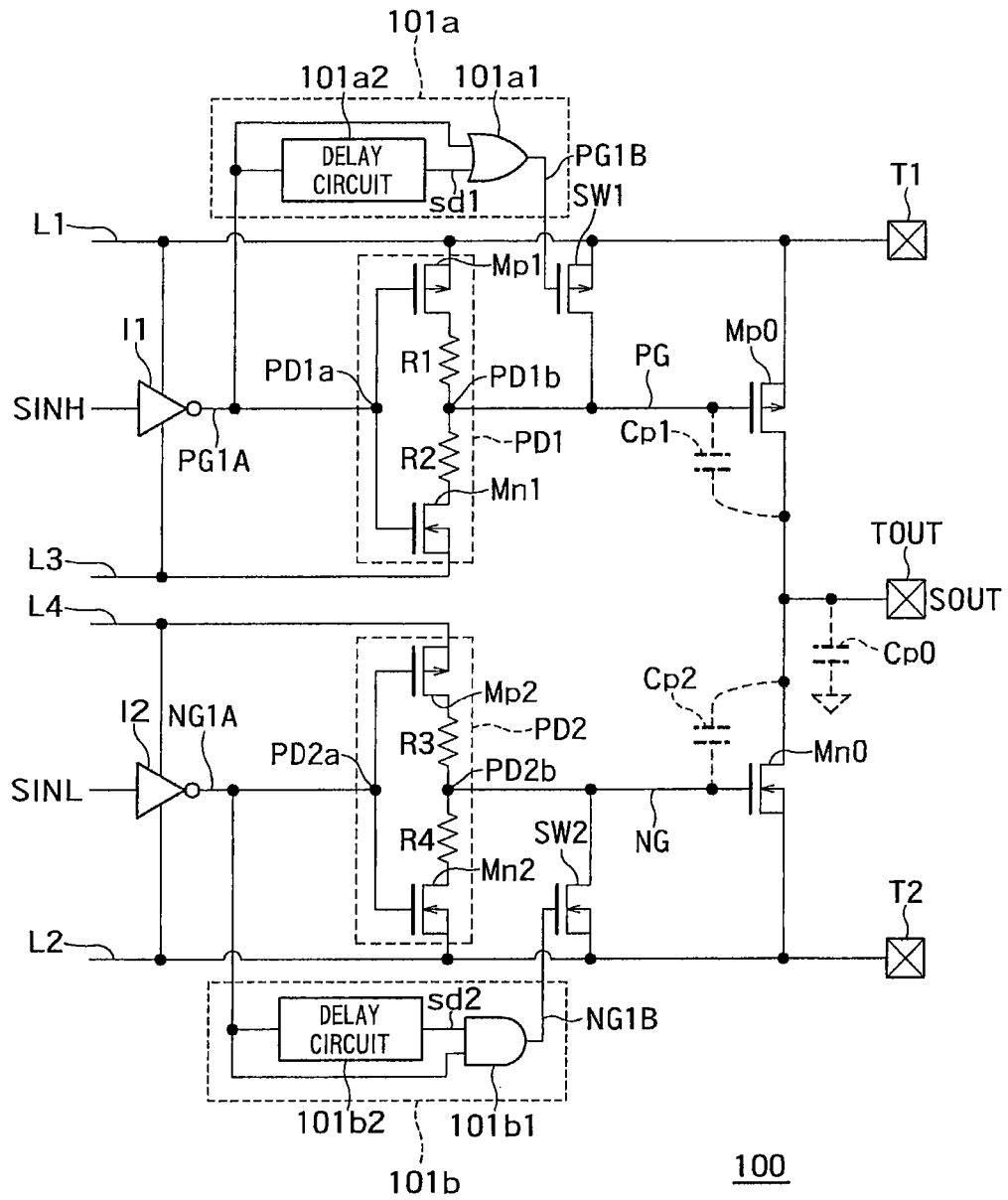
FIG. 1 is a circuit diagram showing an example of a configuration of a driver circuit 100 according to a first embodiment.

FIG. 1 is a circuit diagram showing an example of a configuration of a driver circuit 100 according to a first embodiment.

As shown in FIG. 1, the driver circuit 100 includes a first terminal "T1", a second terminal "T2", an output terminal "TOUT", first to fourth potential lines "L1" to "L4", an output pMOS transistor "Mp0", an output nMOS transistor "Mn0", an auxiliary pMOS transistor "SW1", an auxiliary nMOS transistor "SW2", a first pre-driver circuit "PD1", a second pre-driver circuit "PD2", a first controlling circuit 101a, a second controlling circuit 101b, a first inverter "I1", and a second inverter "I2".

A first potential (power supply potential, for example) is applied to the first terminal "T1".

A second potential (ground potential, for example) lower than the first potential is applied to the second terminal "T2".

The first potential line "L1" is connected to the first terminal "T1", for example. In this case, the potential of the first potential line "L1" is the power supply potential.

The potential of the second potential line "L2" is set to be lower than the potential of the first potential line "L1". The second potential line "L2" is connected to the second terminal "T2", for example. In this case, the potential of the second potential line "L2" is the ground potential.

The potential of the third potential line "L3" is set to be lower than the potential of the first potential line "L1". The third potential line "L3" is connected to the second potential line "L2", for example. In this case, the potential of the third potential line "L3" is the ground potential.

The potential of the fourth potential line "L4" is set to be higher than the potential of the second potential line "L2". The fourth potential line "L4" is connected to the first potential line "L1", for example. In this case, the potential of the fourth potential line "L4" is the power supply potential.

The output terminal "TOUT" is configured to output an output signal "SOUT". There is a parasitic capacitor "Cp0" between the output terminal "TOUT" and the ground.

The first inverter "I1" is configured to receive a first input signal "SINH", invert the first input signal "SINH", and output the resulting signal as a first pulse signal "PG1A".

The second inverter "I2" is configured to receive a second input signal "SINL", invert the second input signal "SINL", and output the resulting signal as a second pulse signal "NG1A".

The output pMOS transistor "Mp0" is connected to the first terminal "T1" at the source thereof and to the output terminal "TOUT" at the drain, thereof, and the source and the back gate of the output pMOS transistor "Mp0" are connected to each other.

There is a parasitic capacitor "Cp1" between the gate and the drain of the output pMOS transistor "Mp0".

The output nMOS transistor "Mn0" is connected to the second terminal "T2" at the source thereof and to the output terminal "TOUT" at the drain thereof, and the source and the back gate of the output nMOS transistor "Mn0" are connected to each other.

There is a parasitic capacitor "Cp2" between the gate and the drain of the output nMOS transistor "Mn0".

The first pre-driver circuit "PD1" is connected to the gate of the output pMOS transistor "Mp0" at an output part "PD1$b$" thereof. The first pre-driver circuit "PD1" is configured to receive the first pulse signal "PG1A" at an input part "PD1$a$" thereof, invert the first pulse signal "PG1A", and output the resulting signal as a first gate signal "PG" at the output part "PD1$b$".

As shown in FIG. 1, the first pre-driver circuit "PD1" includes a first pMOS transistor "Mp1", a first nMOS transistor "Mn1", a first resistor "R1", and a second resistor "R2", for example.

The first pMOS transistor "Mp1" is connected to the first potential line "L1" at the source thereof and to the input part "PD1$a$" of the first pre-driver circuit "PD1" at the gate thereof.

The first resistor "R1" is connected between the drain of the first pMOS transistor "Mp1" and the output part "PD1$b$" of the first pre-driver circuit "PD1".

The first nMOS transistor "Mn1" is connected to the third potential line "L3" having a lower potential than the first potential line "L1" at the source thereof and to the input part "PD1$a$" of the first pre-driver circuit "PD1" at the gate thereof.

The second resistor "R2" is connected between the drain of the first nMOS transistor "Mn1" and the output part "PD1$b$" of the first pre-driver circuit "PD1".

The second pre-driver circuit "PD2" is connected to the gate of the output nMOS transistor "Mn0" at an output part "PD2$b$" thereof. The second pre-driver circuit "PD2" is configured to receive the second pulse signal "NG1A" at an input part "PD2$a$" thereof, invert the second pulse signal "NG1A", and output the resulting signal as a second gate signal "NG" at the output part "PD2$b$".

As shown in FIG. 1, the second pre-driver circuit "PD2" includes a second pMOS transistor "Mp2", a second nMOS transistor "Mn2", a third resistor "R3", and a fourth resistor "R4", for example.

The second pMOS transistor "Mp2" is connected to the fourth potential line "L4" having a higher potential than the second potential line "L2" at the source thereof and to the input part "PD2$a$" of the second pre-driver circuit "PD2" at the gate thereof.

The third resistor "R3" is connected between the drain of the second pMOS transistor "Mp2" and the output part "PD2$b$" of the second pre-driver circuit "PD2".

The second nMOS transistor "Mn2" is connected to the second potential line "L2" at the source thereof and to the input part "PD2$a$" of the second pre-driver circuit "PD2" at the gate thereof.

The fourth resistor "R4" is connected between the drain of the second nMOS transistor "Mn2" and the output part "PD2$b$" of the second pre-driver circuit "PD2".

The first pMOS transistor "Mp1", the second nMOS transistor "Mn1", the second pMOS transistor "Mp2", and the second nMOS transistor "Mn2" described above have the source and the back gate connected to each other.

The first pre-driver circuit "PD1" and the second pre-driver circuit "PD2" may have the resistors inserted on the source side rather than the drain side or may be implemented by a current source.

Furthermore, as shown in FIG. 1, the auxiliary pMOS transistor "SW1" is connected to the first potential line "L1" at the source thereof and to the gate of the output pMOS transistor "Mp0" (in other words, the output part "PD1$b$") at the drain thereof. The auxiliary pMOS transistor "SW1" has the source and the back gate connected to each other.

The auxiliary nMOS transistor "SW2" is connected to the second potential line "L2" at the source thereof and to the gate of the output nMOS transistor "Mn0" (in other words, the output part "PD2$b$") at the drain thereof. The auxiliary nMOS transistor "SW2" has the source and the back gate connected to each other.

The first controlling circuit 101$a$ is configured to receive the first pulse signal "PG1A". The first controlling circuit 101$a$ is configured to output, to the gate of the auxiliary pMOS transistor "SW1", a first controlling signal "PG1B" that rises in synchronization with a rising of the first pulse signal "PG1A" and falls after a delay from a falling of the first pulse signal "PG1A".

As shown in FIG. 1, the first controlling circuit 101$a$ includes an OR circuit 101$a$1 and a first delay circuit 101$a$2, for example.

The first delay circuit 101$a$2 is configured to receive the first pulse signal "PG1A". The first delay circuit 101$a$2 is configured to output a first delay signal "sd1" that is the received first pulse signal "PG1A" delayed for a first delay time "td1".

The OR circuit 101$a$1 is configured to receive the first pulse signal "PG1A" and the first delay signal "sd1". The OR circuit 101$a$1 is configured to perform a calculation of the first pulse signal "PG1A" and the first delay signal "sd1" and output the resulting signal as the first controlling signal "PG1B".

The second controlling circuit 101$b$ is configured to receive the second pulse signal "NG1A" and output, to the gate of the auxiliary nMOS transistor "SW2", a second controlling signal "NG1B" that rises after a delay from a rising of the second pulse signal "NG1A" and falls in synchronization with a falling of the second pulse signal "NG1A".

As shown in FIG. 1, the second controlling circuit 101$b$ includes an AND circuit 101$b$1 and a second delay circuit 101$b$2, for example.

The second delay circuit 101$b$2 is configured to receive the second pulse signal "NG1A". The second delay circuit 101$b$2 is configured to output a second delay signal "sd2" that is the received second pulse signal "NG1A" delayed for a second delay time "td2".

The AND circuit 101$b$1 is configured to receive the second pulse signal "NG1A" and the second delay signal "sd2". The AND circuit 101$b$1 is configured to perform a calculation of the second pulse signal "NG1A" and the second delay signal "sd2" and output the resulting signal as the second controlling signal "NG1B".

Next, characteristics of the driver circuit according to this embodiment configured as described above will be described.

Figure 2:
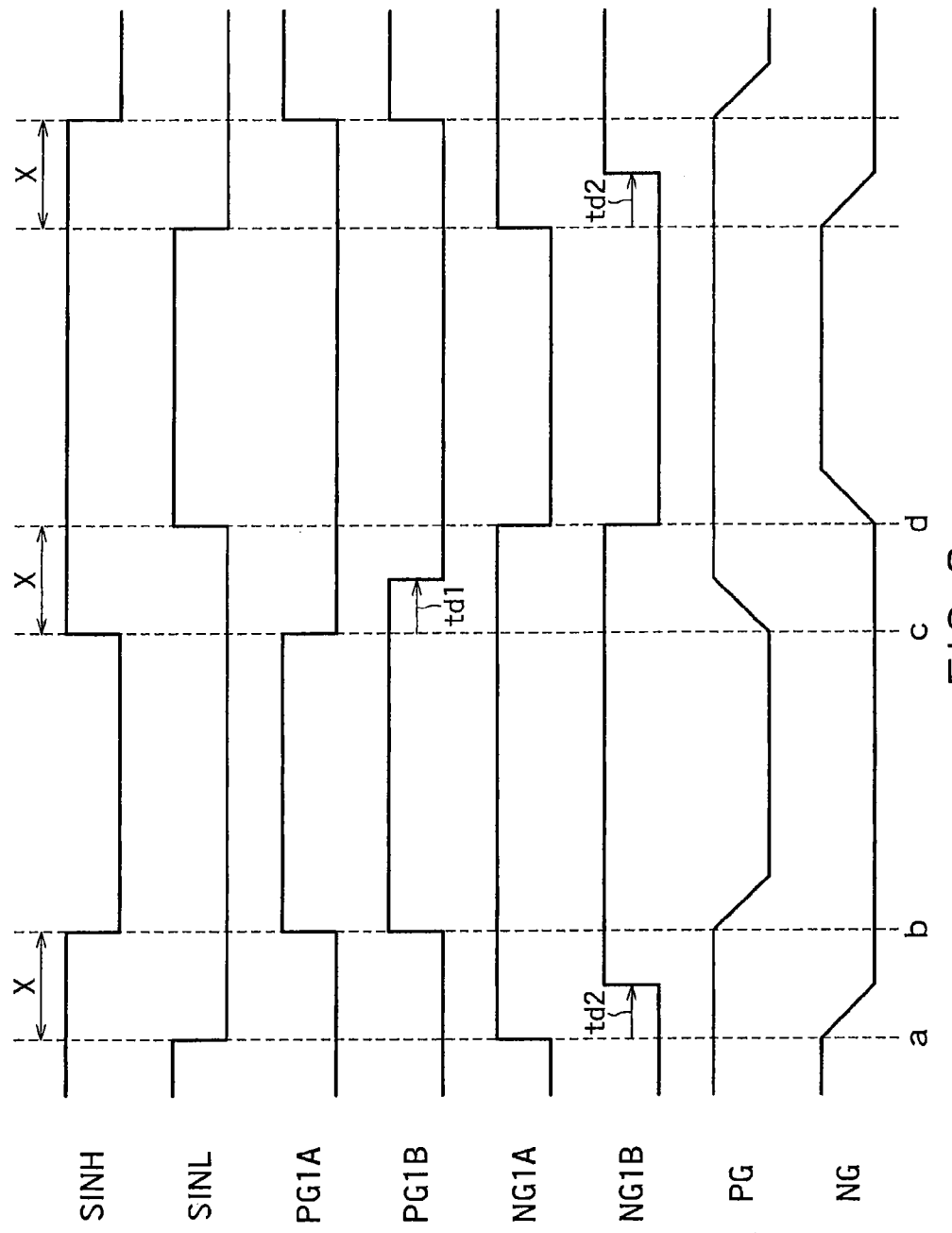
FIG. 2 is a waveform diagram showing an example of a waveform of each signal in the driver circuit 100 shown in FIG. 1.

FIG. 2 is a waveform diagram showing an example of a waveform of each signal in the driver circuit 100 shown in FIG. 1.

As shown in FIG. 2, the first input signal "SINH" falls after a lapse of a dead time "X" after a falling of the second input signal "SINL". The second input signal "SINL" rises after a lapse of the dead time "X" after a rising of the first input signal "SINH".

Therefore, the first pulse signal "PG1A" rises after a lapse of the dead time "X" after a rising of the second pulse signal "NG1A". The second pulse signal "NG1A" falls after a lapse of the dead time "X" after a falling of the first pulse signal "PG1A".

For example, at a time "a", in response to a rising of the second pulse signal "NG1A", the second pre-driver circuit "PD2" starts decreasing the potential of the second gate signal "NG".

Then, after a lapse of the second delay time "td2", the second controlling circuit 101b raises the second controlling signal "NG1B" (to the potential of the fourth potential line "L4", that is, the power supply potential). As a result, the auxiliary nMOS transistor "SW2" is turned on, and the second gate signal "NG" sufficiently falls (to the ground potential).

On the other hand, at a time "b" after a lapse of the dead time "X", in response to a rising of the first pulse signal "PG1A", the first pre-driver circuit "PD1" starts decreasing the potential of the first gate signal "PG". As a result, the output pMOS transistor "Mp0" is turned on, and the potential of the signal "SOUT" rises.

At the time "b", since the auxiliary nMOS transistor "SW2" has already been turned on, even if there is the parasitic capacitor "Cp2" as described above, the potential of the second gate signal "NG" does not rise but is fixed at the ground potential, and the output nMOS transistor "Mn0" is kept in the off state. That is, no through current flows between the output pMOS transistor "Mp0" and the output nMOS transistor "Mn0".

Similarly, at a time "c", in response to a falling of the first pulse signal "PG1A", the first pre-driver circuit "PD1" starts increasing the potential of the first gate signal "PG".

Then, after a lapse of the first delay time "td1", the first controlling circuit 101a lowers the first controlling signal "PG1B" (to the potential of the third potential line "L3", that is, the ground potential). As a result, the auxiliary pMOS transistor "SW1" is turned on, and the first gate signal "PG" sufficiently rises (to the power supply potential).

On the other hand, at a time "d" after a lapse of the dead time "X", in response to a falling of the second pulse signal "NG1A", the second pre-driver circuit "PD2" starts increasing the potential of the second gate signal "NG". As a result, the output nMOS transistor "Mn0" is turned on, and the potential of the signal "SOUT" falls.

At the time "d", since the auxiliary pMOS transistor "SW1" has already been turned on, even if there is the parasitic capacitor "Cp1" as described above, the potential of the first gate signal "PG" does not fall but is fixed at the power supply potential, and the output pMOS transistor "Mp0" is kept in the off state. That is, no through current flows between the output pMOS transistor "Mp0" and the output nMOS transistor "Mn0".

As described above, the lengths of the first delay time "td1" and the second delay time "td2" are equal to or less than the length of the dead time "X". For example, the length of the first delay time "td1" is set to be equal to the length of the second delay time "td2".

As described above, the driver circuit according to this embodiment can reduce the effect of the parasitic capacitors to suppress the through current.

When the auxiliary pMOS transistor "SW1" on the high side and the auxiliary nMOS transistor "SW2" on the low side have different driving voltages, a level shifter may be added to the circuit as required.

(Second Embodiment)

In the first embodiment, there has been described an example of the configuration that generates controlling signals that control the auxiliary MOS transistors from signals after generation of the dead time.

In a second embodiment, there will be described an example of the configuration that generates controlling signals that control the auxiliary MOS transistors at the same time as generating signals including a dead time.

Figure 3:
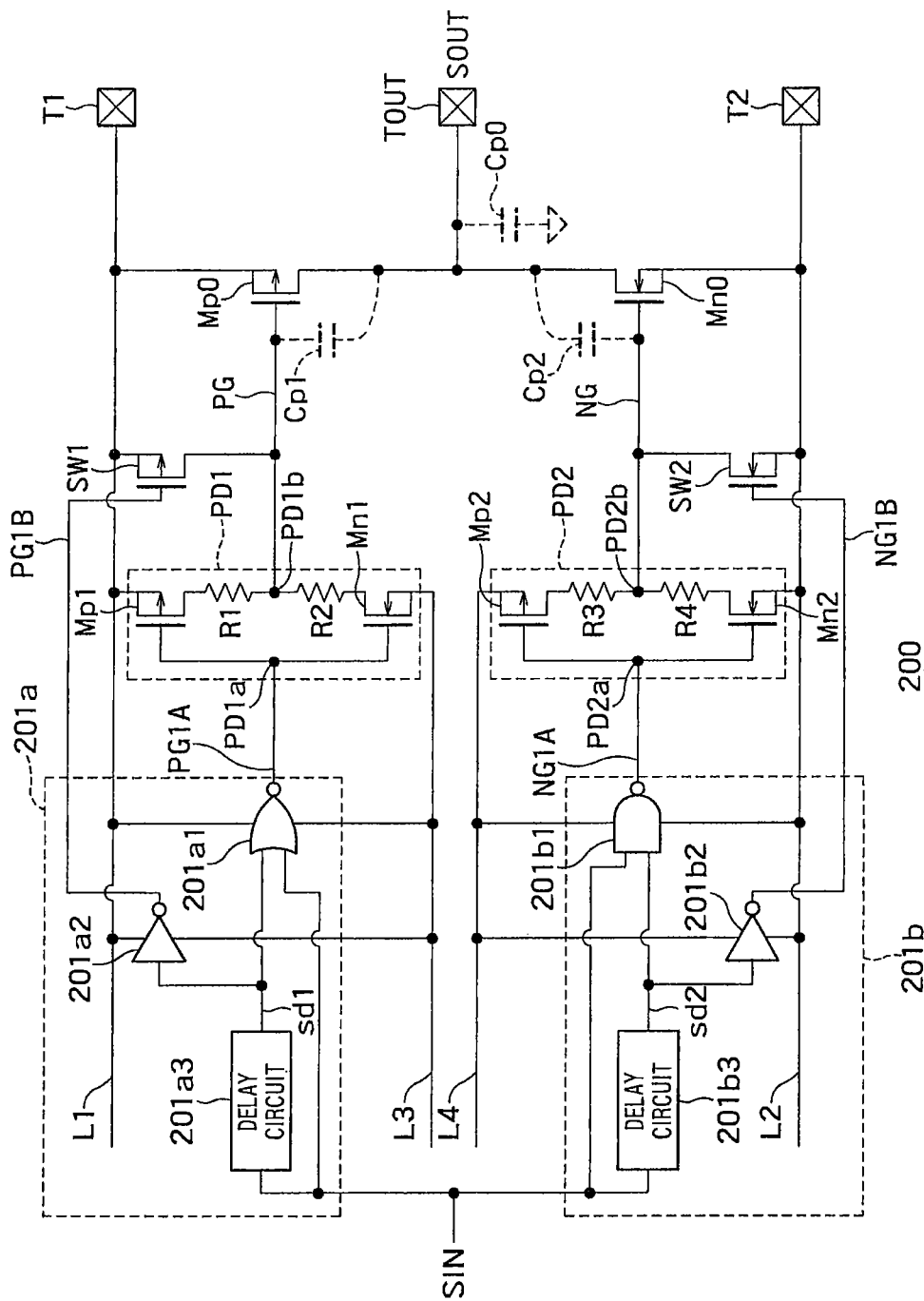
FIG. 3 is a circuit diagram showing an example of a configuration of a driver circuit 200 according to the second embodiment.

FIG. 3 is a circuit diagram showing an example of a configuration of a driver circuit 200 according to the second embodiment. In FIG. 3, the same reference symbols as those in FIG. 1 denote the same components as those in the first embodiment.

As shown in FIG. 3, the driver circuit 200 includes the first terminal "T1", the second terminal "T2", the output terminal "TOUT", the first to fourth potential lines "L1" to "L4", the output pMOS transistor "Mp0", the output nMOS transistor "Mn0", the auxiliary pMOS transistor "SW1", the auxiliary nMOS transistor "SW2", the first pre-driver circuit "PD1", the second pre-driver circuit "PD2", a first controlling circuit 201a, and a second controlling circuit 201b.

The driver circuit 200 differs from the driver circuit 100 according to the first embodiment in that the first controlling circuit 201a and the second controlling circuit 201b generates the dead time.

The first controlling circuit 201a is configured to receive an input signal "SIN".

The first controlling circuit 201a is configured to output, to the input part "PD1a" of the first pre-driver circuit "PD1", the first pulse signal "PG1A" that rises after a delay from a falling of the input signal "SIN" and falls in synchronization with a rising of the input signal "SIN".

Furthermore, the first controlling circuit 201a is configured to output, to the gate of the auxiliary pMOS transistor "SW1", the first controlling signal "PG1B" that rises after a delay from a falling of the input signal "SIN" and falls after a delay from a rising of the input signal "SIN".

As shown in FIG. 3, the first controlling circuit 201a includes an NOR circuit 201a1, a first inverter 201a2, and a first delay circuit 201a3, for example.

The first delay circuit 201a3 is configured to receive the input signal "SIN" and output the first delay signal "sd1" that is the received input signal "SIN" delayed for the first delay time "td1".

The NOR circuit 201a1 is configured to receive the input signal "SIN" and the first delay signal "sd1", perform a calculation of the input signal "SIN" and the first delay signal "sd1" and output the resulting signal as the first pulse signal "PG1A".

The first inverter 201a2 is configured to receive the first delay signal "sd1", inverts the received first delay signal "sd1" and outputs the resulting signal as the first controlling signal "PG1B".

The second controlling circuit 201b is configured to receive the input signal "SIN".

The second controlling circuit 201b is configured to output, to the input part "PD2a" of the second pre-driver circuit "PD2", the second pulse signal "NG1A" that rises in synchronization with a falling of the input signal "SIN" and falls after a delay from a rising of the input signal "SIN".

Furthermore, the second controlling circuit 201b is configured to output, to the gate of the auxiliary nMOS transistor "SW2", the second controlling signal "NG1B" that rises after a delay from a falling of the input signal "SIN" and falls after a delay from a rising of the input signal "SIN".

The second controlling circuit 201b includes a NAND circuit 201b1, a second inverter 201b2 and a second delay circuit 201b3, for example.

The second delay circuit 201b3 is configured to receive the input signal "SIN" and output the second delay signal "sd2" that is the received signal "SIN" delayed for the second delay time "td2".

The NAND circuit 201b1 is configured to receive the input signal "SIN" and the second delay signal "sd2", perform a calculation of the input signal "SIN" and the second delay signal "sd2" and output the resulting signal as the second pulse signal "NG1A".

The second inverter 201b2 is configured to receive the second delay signal "sd2", inverts the received second delay signal "sd2" and output the resulting signal as the second controlling signal "NG1B".

The remainder of the configuration of the driver circuit 200 is the same as that of the driver circuit 100 according to the first embodiment.

Next, characteristics of the driver circuit according to this embodiment configured as described above will be described.

Figure 4:
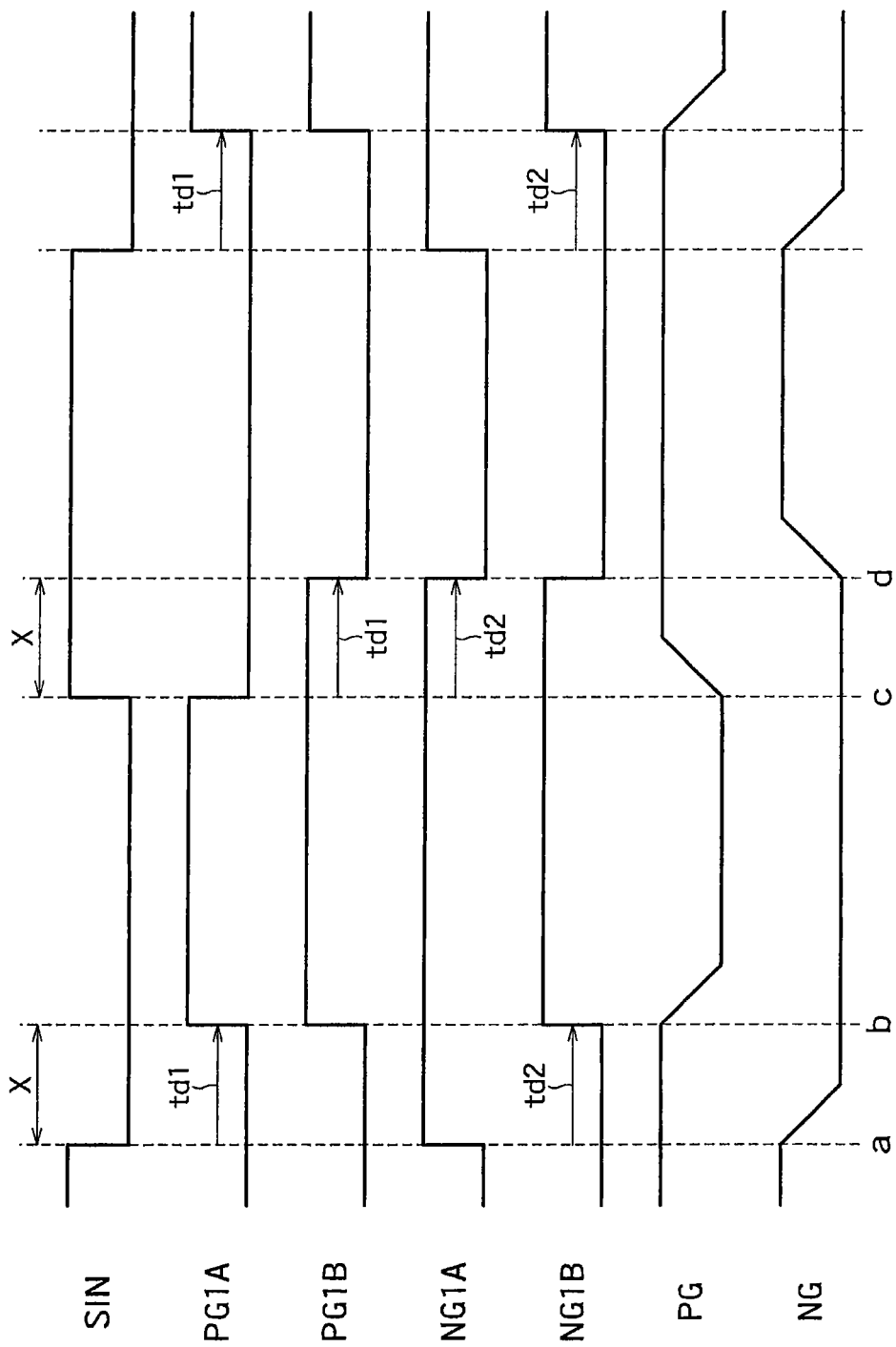
FIG. 4 is a waveform diagram showing an example of a waveform of each signal in the driver circuit 200 shown in FIG. 3.

FIG. 4 is a waveform diagram showing an example of a waveform of each signal in the driver circuit 200 shown in FIG. 3.

For example, at the time "a", in response to a rising of the second pulse signal "NG1A", the second pre-driver circuit "PD2" starts decreasing the potential of the second gate signal "NG".

Then, after a lapse of the second delay time "td2", the second controlling circuit 201b raises the second controlling signal "NG1B" (to the potential of the fourth potential line "L4", that is, the power supply potential). As a result, the auxiliary nMOS transistor "SW2" is turned on, and the second gate signal "NG" sufficiently falls (to the ground potential).

On the other hand, at the time "b" after a lapse of the dead time "X", in response to a rising of the first pulse signal "PG1A", the first pre-driver circuit "PD1" starts decreasing the potential of the first gate signal "PG". As a result, the output pMOS transistor "Mp0" is turned on, and the potential of the signal "SOUT" rises.

At the time "b", since the auxiliary nMOS transistor "SW2" has already been turned on, even if there is the parasitic capacitor "Cp2" as described above, the potential of the second gate signal "NG" does not rise but is fixed at the ground potential, and the output nMOS transistor "Mn0" is kept in the off state. That is, no through current flows between the output pMOS transistor "Mp0" and the output nMOS transistor "Mn0".

Similarly, at the time "c", in response to a falling of the first pulse signal "PG1A", the first pre-driver circuit "PD1" starts increasing the potential of the first gate signal "PG".

Then, after a lapse of the first delay time "td1", the first controlling circuit 201a lowers the first controlling signal "PG1B" (to the potential of the third potential line "L3", that is, the ground potential). As a result, the auxiliary pMOS transistor "SW1" is turned on, and the first gate signal "PG" sufficiently rises (to the power supply potential).

On the other hand, at the time "d" after a lapse of the dead time "X", in response to a falling of the second pulse signal "NG1A", the second pre-driver circuit "PD2" starts increasing the potential of the second gate signal "NG". As a result, the output nMOS transistor "Mn0" is turned on, and the potential of the signal "SOUT" falls.

At the time "d", since the auxiliary pMOS transistor "SW1" has already been turned on, even if there is the parasitic capacitor "Cp1" as described above, the potential of the first gate signal "PG" does not fall but is fixed at the power supply potential, and the output pMOS transistor "Mp0" is kept in the off state. That is, no through current flows between the output pMOS transistor "Mp0" and the output nMOS transistor "Mn0".

As described above, the driver circuit according to this embodiment can reduce the effect of the parasitic capacitors to suppress the through current.

When the auxiliary pMOS transistor "SW1" on the high side and the auxiliary nMOS transistor "SW2" on the low side have different driving voltages, a level shifter may be added to the circuit as required.

(Third Embodiment)

In a third embodiment, there will be described another example of the configuration that generates controlling signals that control the auxiliary MOS transistors at the same time as generating signals including a dead time.

Figure 5:
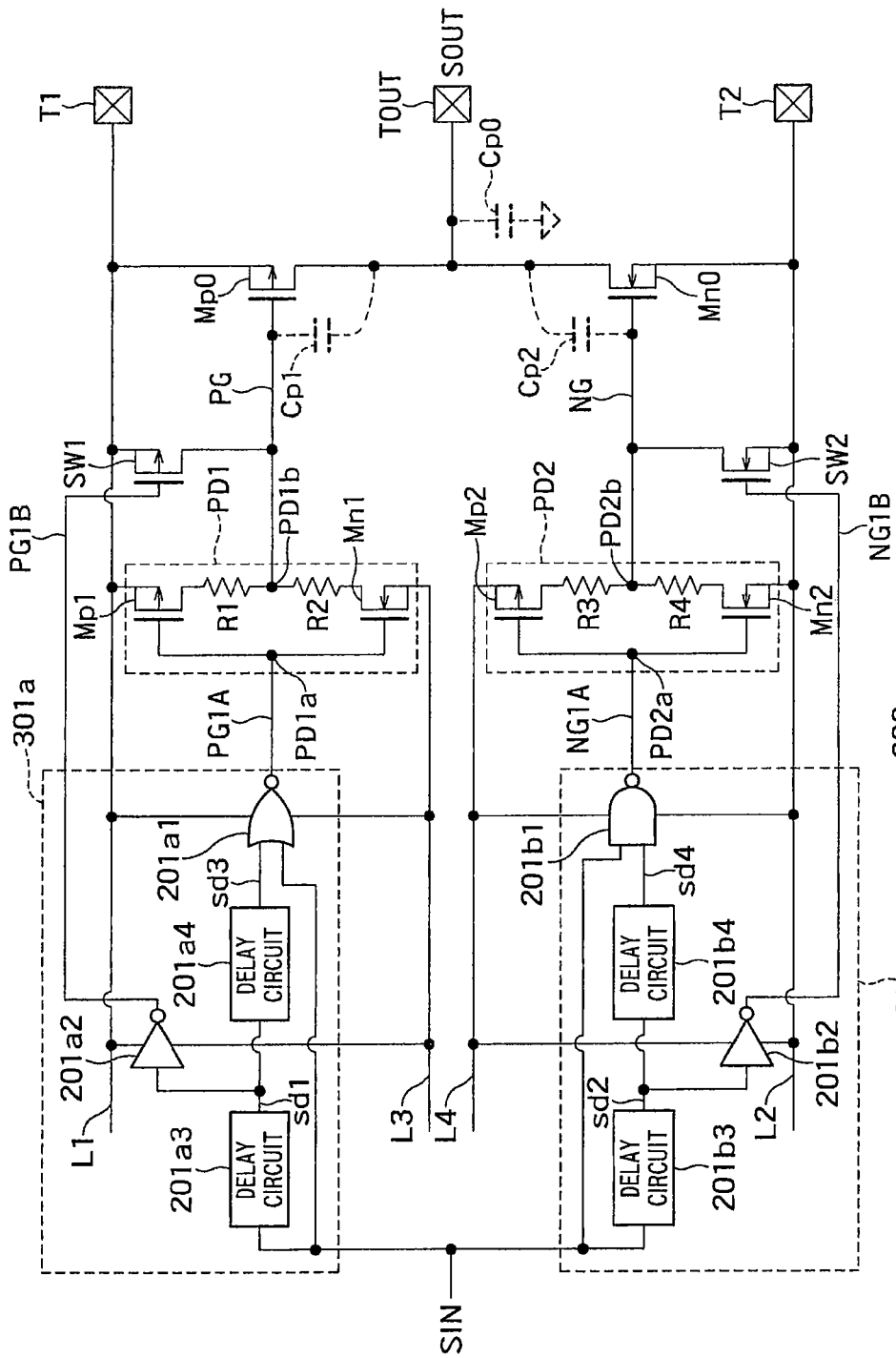
FIG. 5 is a circuit diagram showing an example of a configuration of a driver circuit 300 according to the third embodiment.

FIG. 5 is a circuit diagram showing an example of a configuration of a driver circuit 300 according to the third embodiment. In FIG. 5, the same reference symbols as those in FIG. 3 denote the same components as those in the second embodiment.

As shown in FIG. 5, the driver circuit 300 includes the first terminal "T1", the second terminal "T2", the output terminal "TOUT", the first to fourth potential lines "L1" to "L4", the output pMOS transistor "Mp0", the output nMOS transistor "Mn0", the auxiliary pMOS transistor "SW1", the auxiliary nMOS transistor "SW2", the first pre-driver circuit "PD1", the second pre-driver circuit "PD2", a first controlling circuit 301a, and a second controlling circuit 301b.

The first controlling circuit 301a differs from the first controlling circuit 201a according to the second embodiment in that it further includes a third delay circuit 201a4.

The third delay circuit 201a4 is configured to delay the first delay signal "sd1" for a third delay time "td3" and output the resulting signal (referred to as a third delay signal "sd3") to the NOR circuit 201a1.

The second controlling circuit 301b differs from the second controlling circuit 201b according to the second embodiment in that it further includes a fourth delay circuit 201b4.

The fourth delay circuit 201b4 is configured to delay the second delay signal "sd2" for a fourth delay time "td4" and output the resulting signal (referred to as a fourth delay signal "sd4") to the NAND circuit 201b1.

The remainder of the configuration of the driver circuit 300 is the same as that of the driver circuit 200 according to the second embodiment.

Next, characteristics of the driver circuit according to this embodiment configured as described above will be described.

Figure 6:
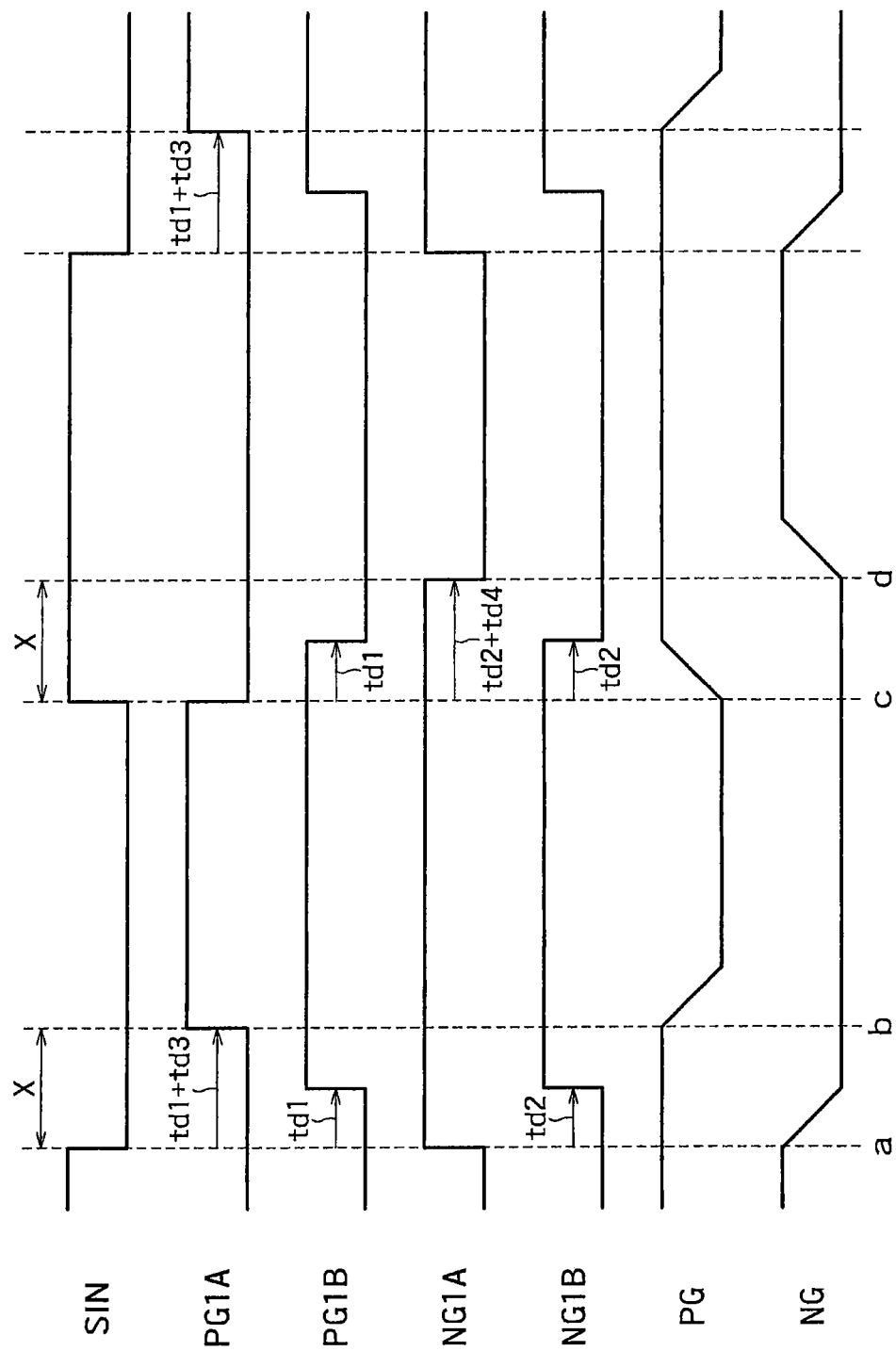
FIG. 6 is a waveform diagram showing an example of a waveform of each signal in the driver circuit 300 shown in FIG. 5.

FIG. 6 is a waveform diagram showing an example of a waveform of each signal in the driver circuit 300 shown in FIG. 5.

For example, at the time "a", in response to a rising of the second pulse signal "NG1A", the second pre-driver circuit "PD2" starts decreasing the potential of the second gate signal "NG".

Then, after a lapse of the second delay time "td2", the second controlling circuit 301b raises the second controlling signal "NG1B" (to the potential of the fourth potential line "L4", that is, the power supply potential). As a result, the auxiliary nMOS transistor "SW2" is turned on, and the second gate signal "NG" sufficiently falls (to the ground potential).

On the other hand, at the time "b" after a lapse of the dead time "X" (which equals to the sum of the first delay time "td1" and the third delay time "td3"), in response to a rising of the first pulse signal "PG1A", the first pre-driver circuit "PD1" starts decreasing the potential of the first gate signal "PG". As a result, the output pMOS transistor "Mp0" is turned on, and the potential of the signal "SOUT" rises.

At the time "b", since the auxiliary nMOS transistor "SW2" has already been turned on, even if there is the parasitic capacitor "Cp2" as described above, the potential of the second gate signal "NG" does not rise but is fixed at the ground potential, and the output nMOS transistor "Mn0" is kept in the off state. That is, no through current flows between the output pMOS transistor "Mp0" and the output nMOS transistor "Mn0".

Similarly, at the time "c", in response to a falling of the first pulse signal "PG1A", the first pre-driver circuit "PD1" starts increasing the potential of the first gate signal "PG".

Then, after a lapse of the first delay time "td1", the first controlling circuit 301a lowers the first controlling signal "PG1B" (to the potential of the third potential line "L3", that is, the ground potential). As a result, the auxiliary pMOS transistor "SW1" is turned on, and the first gate signal "PG" sufficiently rises (to the power supply potential).

On the other hand, at the time "d" after a lapse of the dead time "X" (which equals to the sum of the second delay time "td2" and the fourth delay time "td4"), in response to a falling of the second pulse signal "NG1A", the second pre-driver circuit "PD2" starts increasing the potential of the second gate signal "NG". As a result, the output nMOS transistor "Mn0" is turned on, and the potential of the signal "SOUT" falls.

At the time "d", since the auxiliary pMOS transistor "SW1" has already been turned on, even if there is the parasitic capacitor "Cp1" as described above, the potential of the first gate signal "PG" does not fall but is fixed at the power supply potential, and the output pMOS transistor "Mp0" is kept in the off state. That is, no through current flows between the output pMOS transistor "Mp0" and the output nMOS transistor "Mn0".

According to the second embodiment described earlier, the auxiliary MOS transistors may not able to operate at desired times because of the difference in delay time between the first and second controlling circuits.

To solve the problem, according to the third embodiment, the third and fourth delay circuits are additionally provided to ensure that the auxiliary MOS transistors are turned on before the output MOS transistors are turned on.

As for the time of turning off of the auxiliary MOS transistors, the auxiliary MOS transistors can be turned off before the first and fourth MOS transistors are turned off.

As described above, the driver circuit according to this embodiment can reduce the effect of the parasitic capacitors to suppress the through current.

When the auxiliary pMOS transistor "SW1" on the high side and the auxiliary nMOS transistor "SW2" on the low side have different driving voltages, a level shifter may be added to the circuit as required.

(Fourth Embodiment)

In a fourth embodiment, there will be described another example of the configuration that generates controlling signals that control the auxiliary MOS transistors at the same time as generating signals including a dead time.

Figure 7:
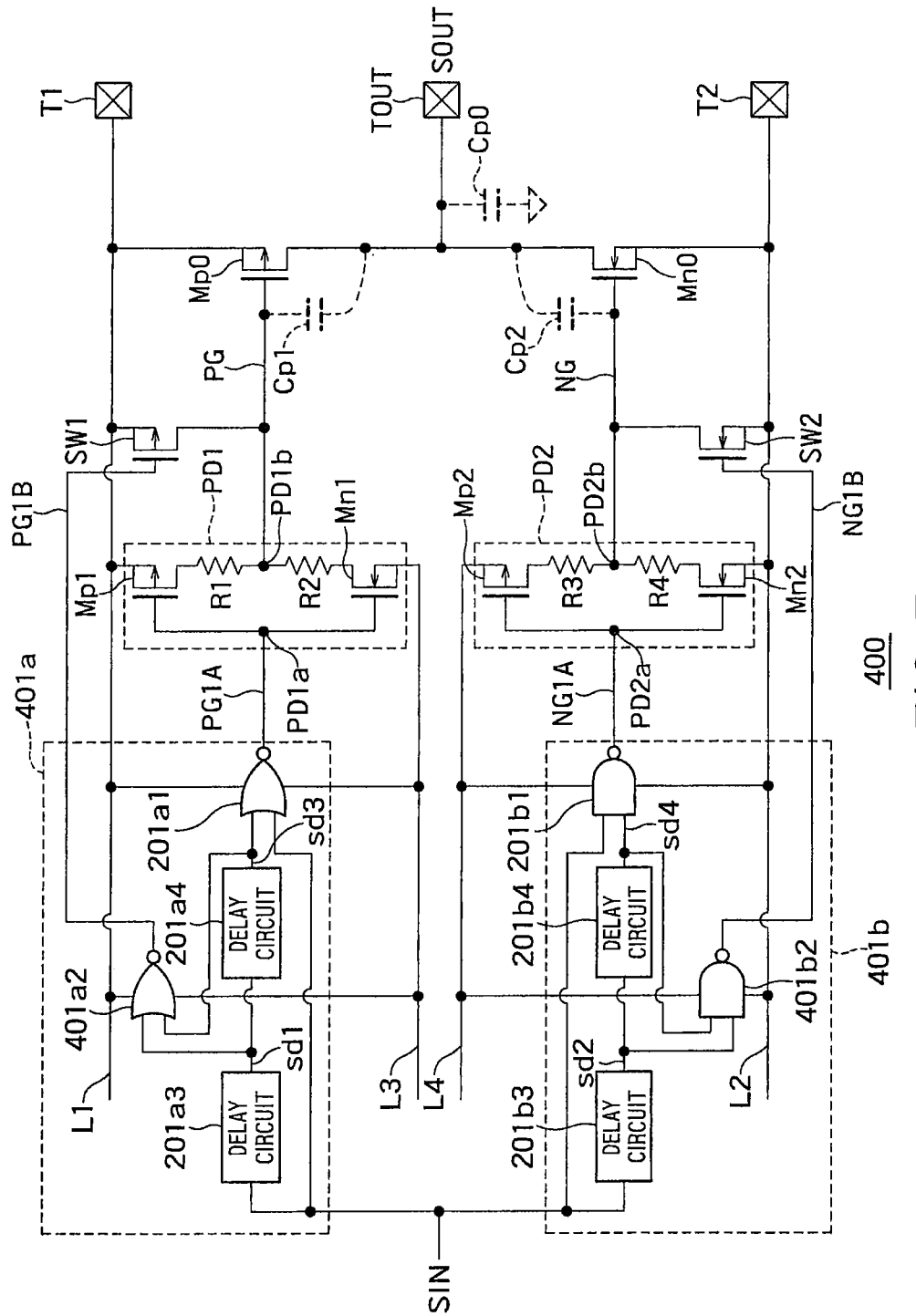
FIG. 7 is a circuit diagram showing an example of a configuration of a driver circuit 400 according to the fourth embodiment.

FIG. 7 is a circuit diagram showing an example of a configuration of a driver circuit 400 according to the fourth embodiment, In FIG. 7, the same reference symbols as those in FIG. 5 denote the same components as those in the third embodiment.

As shown in FIG. 7, the driver circuit 400 includes the first terminal "T1", the second terminal "T2", the output terminal "TOUT", the first to fourth potential lines "L1" to "L4", the output pMOS transistor "Mp0", the output nMOS transistor "Mn0", the auxiliary pMOS transistor "SW1", the auxiliary nMOS transistor "SW2", the first pre-driver circuit "PD1", the second pre-driver circuit "PD2", a first controlling circuit 401a, and a second controlling circuit 401b.

The first controlling circuit 401a includes the first delay circuit 201a3, the third delay circuit 201a4, the first NOR circuit 201a1, and a second NOR circuit 401a2.

The first delay circuit 201a3 is configured to receive the input signal "SIN" and output the first delay signal "sd1" that is the received signal "SIN" delayed for the first delay time "td1".

The third delay circuit 201a4 is configured to receive the first delay signal "sd1" and output the third delay signal "sd3" that is the received first delay signal "sd1" delayed for the third delay time "td3".

The first NOR circuit 201a1 is configured to receive the input signal "SIN" and the third delay signal "sd3", performs a calculation of the input signal "SIN" and the third delay signal "sd3" and output the resulting signal as the first pulse signal "PG1A".

The second NOR circuit 401a2 is configured to receive the first delay signal "sd1" and the third delay signal "sd3", perform a calculation of the first delay signal "sd1" and the third delay signal "sd3" and output the resulting signal as the first controlling signal "PG1B".

The second controlling circuit 401b includes the second delay circuit 201b3, the fourth delay circuit 201b4, the first NAND circuit 201b1, and a second NAND circuit 401b2.

The second delay circuit 201b3 is configured to receive the input signal "SIN" and output the second delay signal "sd2" that is the received signal "SIN" delayed for the second delay time "td2".

The fourth delay circuit 201b4 is configured to receive the second delay signal "sd2" and output the fourth delay signal "sd4" that is the received second delay signal "sd2" delayed for the fourth delay time "td4".

The first NAND circuit 201b1 is configured to receive the input signal "SIN" and the fourth delay signal "sd4", performs a calculation of the input signal "SIN" and the fourth delay signal "sd4" and output the resulting signal as the second pulse signal "NG1A".

The second NAND circuit 401b2 is configured to receive the second delay signal "sd2" and the fourth delay signal "sd4", perform a calculation of the second delay signal "sd2" and the fourth delay signal "sd4" and output the resulting signal as the second controlling signal "NG1B".

The remainder of the configuration of the driver circuit 400 is the same as that of the driver circuit 300 according to the third embodiment.

Next, characteristics of the driver circuit according to this embodiment configured as described above will be described.

Figure 8:
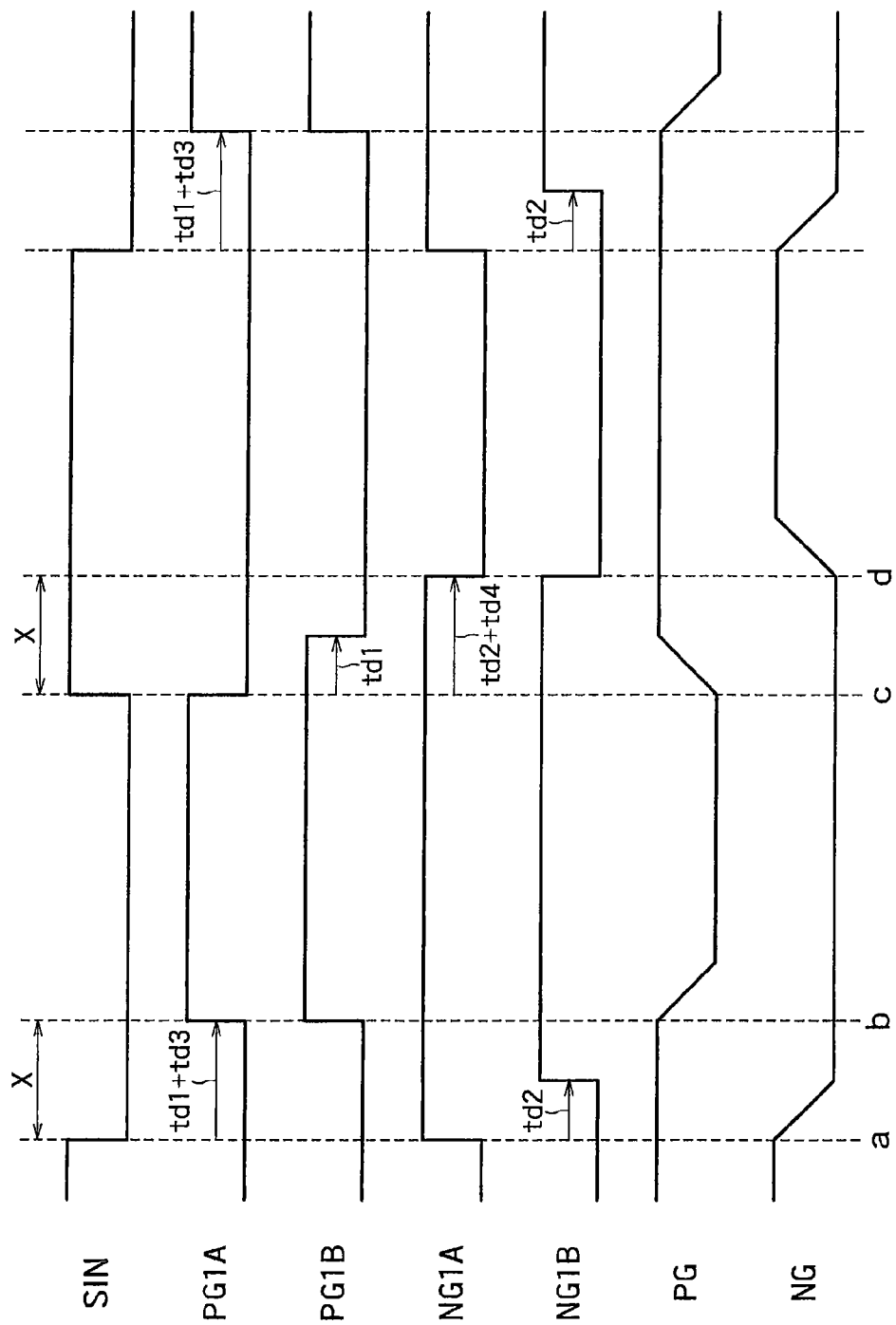
FIG. 8 is a waveform diagram showing an example of a waveform of each signal in the driver circuit 400 shown in FIG. 7.

FIG. 8 is a waveform diagram showing an example of a waveform of each signal in the driver circuit 400 shown in FIG. 7.

For example, at the time "a", in response to a rising of the second pulse signal "NG1A", the second pre-driver circuit "PD2" starts decreasing the potential of the second gate signal "NG".

Then, after a lapse of the second delay time "td2", the second controlling circuit 401b raises the second controlling signal "NG1B" (to the potential of the fourth potential line "L4", that is, the power supply potential). As a result, the auxiliary nMOS transistor "SW2" is turned on, and the second gate signal "NG" sufficiently falls (to the ground potential).

On the other hand, at the time "b" after a lapse of the dead time "X" (which equals to the sum of the first delay time "td1" and the third delay time "td3"), in response to a rising of the first pulse signal "PG1A", the first pre-driver circuit "PD1" starts decreasing the potential of the first gate signal "PG". As a result, the output pMOS transistor "Mp0" is turned on, and the potential of the signal "SOUT" rises.

At the time "b", since the auxiliary nMOS transistor "SW2" has already been turned on, even if there is the parasitic capacitor "Cp2" as described above, the potential of the second gate signal "NG" does not rise but is fixed at the ground potential, and the output nMOS transistor "Mn0" is kept in the off state. That is, no through current flows between the output pMOS transistor "Mp0" and the output nMOS transistor "Mn0".

Similarly, at the time "c", in response to a falling of the first pulse signal "PG1A", the first pre-driver circuit "PD1" starts increasing the potential of the first gate signal "PG".

Then, after a lapse of the first delay time "td1", the first controlling circuit 401a lowers the first controlling signal "PG1B" (to the potential of the third potential line "L3", that is, the ground potential). As a result, the auxiliary pMOS transistor "SW1" is turned on, and the first gate signal "PG" sufficiently rises (to the power supply potential).

On the other hand, at the time "d" after a lapse of the dead time "X" (which equals to the sum of the second delay time "td2" and the fourth delay time "td4"), in response to a falling of the second pulse signal "NG1A", the second pre-driver circuit "PD2" starts increasing the potential of the second gate signal "NG". As a result, the output nMOS transistor "Mn0" is turned on, and the potential of the signal "SOUT" falls.

At the time "d", since the auxiliary pMOS transistor "SW1" has already been turned on, even if there is the parasitic capacitor "Cp1" as described above, the potential of the first gate signal "PG" does not fall but is fixed at the power supply potential, and the output pMOS transistor "Mp0" is kept in the off state. That is, no through current flows between the output pMOS transistor "Mp0" and the output nMOS transistor "Mn0".

The signal waveforms of the first pulse signal "PG1A", the second pulse signal "NG1A", the first controlling signal "PG1B" and the second controlling signal "NG1B" shown in FIG. 8 are the same as the signal waveforms shown in FIG. 2.

As described above, the driver circuit according to this embodiment can reduce the effect of the parasitic capacitors to suppress the through current.

When the auxiliary pMOS transistor "SW1" on the high side and the auxiliary nMOS transistor "SW2" on the low side have different driving voltages, a level shifter may be added to the circuit as required.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A driver circuit, comprising:
an output pMOS transistor that is connected, at a source thereof, to a first terminal to which a first potential is applied and, at a drain thereof, to an output terminal at which an output signal is output, the source and a back gate of the output pMOS transistor being connected to each other;
an output nMOS transistor that is connected, at a source thereof, to a second terminal to which a second potential lower than the first potential is applied and to the output terminal at a drain thereof, the source and a back gate of the output nMOS transistor being connected to each other;
a first pre-driver circuit that is connected to a gate of the output pMOS transistor at an output part thereof, receives a first pulse signal at an input part thereof, and outputs, at an output part thereof, a first gate signal that is obtained by inverting the first pulse signal;
a second pre-driver circuit that is connected to a gate of the output nMOS transistor at an output part thereof, receives a second pulse signal at an input part thereof, and outputs, at an output part thereof, a second gate signal that is obtained by inverting the second pulse signal;
an auxiliary pMOS transistor that is connected to a first potential line at a source thereof and to the gate of the output pMOS transistor at a drain thereof;
an auxiliary nMOS transistor that is connected at a source thereof to a second potential line having a lower potential than the first potential and to the gate of the output nMOS transistor at a drain thereof;
a first controlling circuit that outputs, to a gate of the auxiliary pMOS transistor, a first controlling signal that rises in synchronization with a rising of the first pulse signal and falls after a delay from a falling of the first pulse signal; and
a second controlling circuit that outputs, to a gate of the auxiliary nMOS transistor, a second controlling signal that rises in synchronization with a rising of the second pulse signal and falls after a delay from a falling of the second pulse signal.

2. The driver circuit according to claim 1,
wherein the first pulse signal rises after a lapse of a dead time after a rising of the second pulse signal, and
wherein the second pulse signal falls after a lapse of the dead time after a falling of the first pulse signal.

3. The driver circuit according to claim 2, further comprising:
a first inverter that is configured to receive a first input signal, and output a signal, as the first pulse signal, by inverting the first input signal; and
a second inverter that is configured to receive a second input signal, and output a signal, as the second pulse signal, by inverting the second input signal.

4. The driver circuit according to claim 2,
wherein the first pre-driver circuit comprises:
a first pMOS transistor that is connected to the first potential line at a source thereof and to the input part of the first pre-driver circuit at a gate thereof;
a first resistor that is connected between a drain of the first pMOS transistor and the output part of the first pre-driver circuit;
a first nMOS transistor that is connected, at a source thereof, to a third potential line having a lower potential than the first potential line and to the input part of the first pre-driver circuit at a gate thereof;
a second resistor that is connected between a drain of the first nMOS transistor and the output part of the first pre-driver circuit, and wherein the second pre-driver circuit comprises:
a second pMOS transistor that is connected to a fourth potential line at a source thereof and to the input part of the second pre-driver circuit at a gate thereof, the fourth potential line having a higher potential than the second potential line;
a third resistor that is connected between a drain of the second pMOS transistor and the output part of the second pre-driver circuit;
a second nMOS transistor that is connected to the second potential line at a source thereof, and to the input part of the second pre-driver circuit at a gate thereof;
a fourth resistor that is connected between a drain of the second nMOS transistor and the output part of the second pre-driver circuit.

5. The driver circuit according to claim 1,
wherein the first controlling circuit comprises:
a first delay circuit that receives the first pulse signal and outputs a first delay signal that is obtained by delaying the received first pulse signal for a first delay time; and
an OR circuit that receives the first pulse signal and the first delay signal and outputs, as the first controlling signal, a signal resulting from a calculation of the first pulse signal and the first delay signal, and
wherein the second controlling circuit comprises:
a second delay circuit that receives the second pulse signal and outputs a second delay signal that is obtained by delaying the received second pulse signal for a second delay time; and
an AND circuit that receives the second pulse signal and the second delay signal and outputs, as the second controlling signal, a signal calculated from the second pulse signal and the second delay signal.

6. The driver circuit according to claim 2,
wherein lengths of the first delay time and the second delay time are equal to or less than length of the dead time.

7. The driver circuit according to claim 1, further comprising:
a first inverter that is configured to receive a first input signal, and output a signal, as the first pulse signal, by inverting the first input signal; and
a second inverter that is configured to receive a second input signal, and output a signal, as the second pulse signal, by inverting the second input signal.

8. The driver circuit according to claim 1,
wherein the first pre-driver circuit comprises:
a first pMOS transistor that is connected to the first potential line at a source thereof and to the input part of the first pre-driver circuit at a gate thereof;
a first resistor that is connected between a drain of the first pMOS transistor and the output part of the first pre-driver circuit;
a first nMOS transistor that is connected, at a source thereof, to a third potential line having a lower potential than the first potential line and to the input part of the first pre-driver circuit at a gate thereof;
a second resistor that is connected between a drain of the first nMOS transistor and the output part of the first pre-driver circuit, and
wherein the second pre-driver circuit comprises:
a second pMOS transistor that is connected to a fourth potential line at a source thereof and to the input part of the second pre-driver circuit at a gate thereof, the fourth potential line having a higher potential than the second potential line;
a third resistor that is connected between a drain of the second pMOS transistor and the output part of the second pre-driver circuit;
a second nMOS transistor that is connected to the second potential line at a source thereof, and to the input part of the second pre-driver circuit at a gate thereof;
a fourth resistor that is connected between a drain of the second nMOS transistor and the output part of the second pre-driver circuit.

9. The driver circuit according to claim 8,
wherein the third potential line is connected to the second potential line, and
wherein the fourth potential line is connected to the first potential line.

10. The driver circuit according to claim 1,
wherein the source of the auxiliary pMOS transistor is connected to a back gate of the auxiliary pMOS transistor, and
wherein the source of the auxiliary nMOS transistor is connected to a back gate of the auxiliary nMOS transistor.

11. A driver circuit, comprising:
an output pMOS transistor that is connected, at a source thereof, to a first terminal to which a first potential is applied and, at a drain thereof, to an output terminal at which an output signal is output, the source and a back gate of the output pMOS transistor being connected to each other;
an output nMOS transistor that is connected, at a source thereof, to a second terminal to which a second potential lower than the first potential is applied and to the output terminal at a drain thereof, the source and a back gate of the output nMOS transistor being connected to each other;
a first pre-driver circuit that is connected to a gate of the output pMOS transistor at an output part thereof, receives a first pulse signal at an input part thereof, and outputs, at an output part thereof, a first gate signal that is obtained by inverting the first pulse signal;
a second pre-driver circuit that is connected to a gate of the output nMOS transistor at an output part thereof, receives a second pulse signal at an input part thereof, and outputs, at an output part thereof, a second gate signal that is obtained by inverting the second pulse signal;
an auxiliary pMOS transistor that is connected to a first potential line at a source thereof and to the gate of the output pMOS transistor at a drain thereof;
an auxiliary nMOS transistor that is connected at a source thereof to a second potential line having a lower potential than the first potential and to the gate of the output nMOS transistor at a drain thereof;
a first controlling circuit that outputs, to the input part of the first pre-driver circuit, the first pulse signal that rises after a delay from falling of an input signal and falls in synchronization with a rising of the input signal and outputs, to a gate of the auxiliary pMOS transistor, a first controlling signal that rises after a falling of the input signal and falls after a delay from a rising of the input signal; and
a second controlling circuit that outputs, to the input part of the second pre-driver circuit, the second pulse signal that rises in synchronization with a falling of the input signal and falls after a delay from a rising of the input signal, and outputs, to a gate of the auxiliary nMOS transistor, a second controlling signal that rises after a delay from a falling of the input signal and falls after a delay from a rising of the input signal.

12. The driver circuit according to claim 11,
wherein the first pre-driver circuit comprises:
a first pMOS transistor that is connected to the first potential line at a source thereof and to the input part of the first pre-driver circuit at a gate thereof;

a first resistor that is connected between a drain of the first pMOS transistor and the output part of the first pre-driver circuit;

a first nMOS transistor that is connected, at a source thereof, to a third potential line having a lower potential than the first potential line and to the input part of the first pre-driver circuit at a gate thereof;

a second resistor that is connected between a drain of the first nMOS transistor and the output part of the first pre-driver circuit, and wherein the second pre-driver circuit comprises:

a second pMOS transistor that is connected to a fourth potential line at a source thereof and to the input part of the second pre-driver circuit at a gate thereof, the fourth potential line having a higher potential than the second potential line;

a third resistor that is connected between a drain of the second pMOS transistor and the output part of the second pre-driver circuit;

a second nMOS transistor that is connected to the second potential line at a source thereof, and to the input part of the second pre-driver circuit at a gate thereof;

a fourth resistor that is connected between a drain of the second nMOS transistor and the output part of the second pre-driver circuit.

13. The driver circuit according to claim 12,
wherein the third potential line is connected to the second potential line, and
wherein the fourth potential line is connected to the first potential line.

14. The driver circuit according to claim 11,
wherein the first controlling circuit comprises:
a first delay circuit that receives the input signal and outputs a first delay signal that is obtained by delaying the received input signal for a first delay time;
a NOR circuit that receives the input signal and the first delay signal and outputs, as the first pulse signal, a signal resulting from a calculation of the input signal and the first delay signal; and
a first inverter that is configured to receive a first delay signal, and output a signal, as a first pulse signal, by inverting the first delay signal, and
wherein the second controlling circuit comprises:
a second delay circuit that receives the input signal and outputs a second delay signal that is obtained by delaying the received input signal for a second delay time;
an NAND circuit that receives the input signal and the second delay signal and outputs, as the second pulse signal, a signal resulting from a calculation of the input signal and the second delay signal; and
a second inverter that is configured to receive a second delay signal, and output a signal, as a second pulse signal, by inverting the second delay signal.

15. The driver circuit according to claim 14,
wherein the first controlling circuit further comprises:
a third delay circuit that outputs a signal that is obtained by delaying the first delay signal for a third delay time to the NOR circuit, and wherein the second controlling circuit further comprises:
a fourth delay circuit that outputs a signal that is obtained by delaying the received input signal for a fourth delay time to the NAND circuit.

16. The driver circuit according to claim 11,
wherein the first controlling circuit comprises:
a first delay circuit that receives the input signal and outputs a first delay signal that is obtained by delaying the received input signal for a first delay time;
a second delay circuit that receives the first delay signal and outputs a second delay signal that is obtained by delaying the received first delay signal for a second delay time;
a first NOR circuit that receives the input signal and the second delay signal and outputs, as the first pulse signal, a signal resulting from a calculation of the input signal and the second delay signal; and
a second NOR circuit that receives the first delay signal and the second delay signal and outputs, as the first controlling signal, a signal calculated from the first delay signal and the second delay signal, and
wherein the second controlling circuit comprises:
a third delay circuit that receives the input signal and outputs a third delay signal that is obtained by delaying the received input signal for a third delay time;
a fourth delay circuit that receives the third delay signal and outputs a fourth delay signal that is obtained by delaying the received first third signal for a fourth delay time;
a first NAND circuit that receives the input signal and the second delay signal and outputs, as the first pulse signal, a signal resulting from a calculation of the input signal and the second delay signal; and
a second NAND circuit that receives the first delay signal and the second delay signal and outputs, as the first controlling signal, a signal calculated from the first delay signal and the second delay signal.

17. The driver circuit according to claim 11,
wherein the source of the auxiliary pMOS transistor is connected to a back gate of the auxiliary pMOS transistor, and
wherein the source of the auxiliary nMOS transistor is connected to a back gate of the auxiliary nMOS transistor.

18. The driver circuit according to claim 11,
wherein the first potential line is connected to the first terminal, and
wherein the second potential line is connected to the second terminal.

19. The driver circuit according to claim 11,
wherein the source of the first pMOS transistor is connected to a back gate of the first pMOS transistor,
wherein the source of the first nMOS transistor is connected to a back gate of the first nMOS transistor,
wherein the source of the second pMOS transistor is connected to a back gate of the second pMOS transistor, and
wherein the source of the second nMOS transistor is connected to a back gate of the second nMOS transistor.

20. The driver circuit according to claim 11,
wherein the first potential is a power supply potential, and
wherein the second potential is a ground potential.

* * * * *